United States Patent [19]

Higashi

[11] Patent Number: 4,774,163
[45] Date of Patent: Sep. 27, 1988

[54] PHOTOPOLYMERIZABLE COMPOSITION INCLUDING AN UNSATURATED MONOMER, A PHOTOPOLYMERIZATION INITATOR AND A CARBOZOLE COMPOUND

[75] Inventor: Tatsuji Higashi, Shizuoka, Japan

[73] Assignee: Fuji Photo Film Co., Ltd., Kanagawa, Japan

[21] Appl. No.: 24,472

[22] Filed: Mar. 11, 1987

[30] Foreign Application Priority Data

Mar. 14, 1986 [JP] Japan .................................. 61-56378

[51] Int. Cl.$^4$ ............................................. G03C 1/68
[52] U.S. Cl. ..................... 430/281; 430/920; 430/288; 430/925; 522/902; 522/26; 522/167; 522/63
[58] Field of Search .............. 430/281, 920, 925, 288; 522/902, 26, 167, 63

[56] References Cited

U.S. PATENT DOCUMENTS

| | | | |
|---|---|---|---|
| 3,615,451 | 10/1971 | Hickmann | 430/281 |
| 4,212,970 | 4/1980 | Iwasaki | 430/925 X |
| 4,239,850 | 12/1980 | Kita et al. | 430/281 |
| 4,537,855 | 8/1985 | Ide | 430/287 X |
| 4,598,036 | 7/1986 | Iwasaki et al. | 430/287 X |

*Primary Examiner*—Paul R. Michl
*Assistant Examiner*—Cynthia Hamilton
*Attorney, Agent, or Firm*—Burns, Doane, Swecker & Mathis

[57] ABSTRACT

The present invention relates to a photopolymerizable composition which comprises
(i) a monomer having at least one ethylenic unsaturated radical which is photopolymerizable under actinic light,
(ii) at least one photopolymerizable initiator selected from the group consisting of compounds represented by the formula (I)

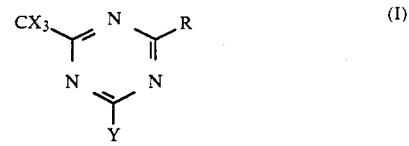

wherein X represents a halogen atom and Y represents $-CH_3$, $-NH_2$, $-NHR'$, $-NR_2$, $-OR'$ (wherein R' represents alkyl, substituted alkyl, aryl or substituted aryl and R represents $-CX_3$, alkyl, substituted alkyl, aryl, substituted aryl or substituted alkenyl) and compounds represented by the formula (II)

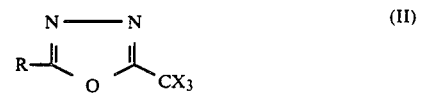

wherein X and R are the same as those of the formula (I) respectively, and
(iii) a carbazole compound represented by the formula (III)

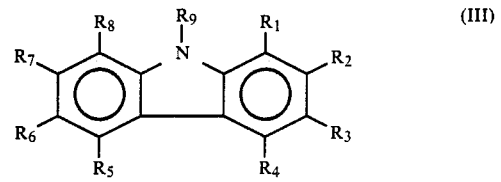

wherein $R_1$, $R_2$, $R_3$, $R_4$, $R_5$, $R_6$, $R_7$ and $R_8$ are hydrogen atom, halogen atom, alkyl, substituted alkyl, aryl, substituted acyl, substituted acyl, aloxy substituted alkoxy, acyloxy or substituted acyloxy, or at least one of $R_1$ and $R_2$, $R_2$ and $R_3$, $R_3$ and $R_4$, $R_5$ and $R_6$, $R_6$ and $R_7$, $R_7$ and $R_8$ form a ring respectively, $R_9$ represents alkyl, substituted alkyl, aryl, substituted aryl, acyl, substituted acyl, akoxy, substituted alkoxy, acyloxy or substituted acyloxy.

The photopolymerizable composition is barely affected by polymerization inhibition by oxygen during imagewise exposure step and is suitable for using as a photosensitive layer of lithographic printing plates.

11 Claims, No Drawings

PHOTOPOLYMERIZABLE COMPOSITION INCLUDING AN UNSATURATED MONOMER, A PHOTOPOLYMERIZATION INITATOR AND A CARBOZOLE COMPOUND

BACKGROUND OF THE INVENTION

Field of the Invention

The present invention relates to a photopolymerizable composition which comprises an unsaturated monomer, a photopolymerization initiator and a carbazole compound, and which further comprises a linear organic high-molecular polymer if necessary. Particularly, the present invention relates to a photopolymerizable composition which is useful in making of a light-sensitive printing plate precursor and which can provide a photo-setting image useful for a photoresist or the like. More particularly, the present invention relates to a novel photopolymerizable composition which is improved such that the composition is barely affected by polymerization inhibition by oxygen during plate-making process (more specifically imagewise exposure step).

DESCRIPTION OF THE INVENTION

The method in which a photo-sensitive composition which is obtained by admixing a polymerizable ethylenic unsaturated compound and a photopolymerization initiator, and optionally a linear organic high-molecular polymer, having a suitable film-forming property, a heat polymerization inhibitor and the like is used and an image is reproduced by a photomechanical process is widely known. More specifically, as described in Japanese Patent Publication Nos. 5093/1960 and 8495/1960, the above photo-sensitive composition undergoes photopolymerization and is insolubilized by exposure to actinic light. Thus a desired photopolymerized image can be formed by applying the light-sensitive composition to form a film, passing an actinic light through a negative of the desired image and removing non-light sensitized areas with a solvent (these steps are hereafter called "processing"). This type of light-sensitive composition is quite useful for printing plates, photoresists and the like.

Up to now, benzyl, benzoyl, benzoinethylether, Michler's ketone, anthraquinone, acridine, phenadine, benzophenone, 2-ethylanthraquinone and the like have been known as exemplary photopolymerization initiators for polymerizable ethylenic unsaturated compound. However, these initiators do not exhibit a practical level of photopolymerization initiation ability and require much time to produce an image by light radiation. In order to overcome this disadvantage, combination of an ordinary radical generator and a light absorber has been proposed. For example, a trihalomethyl compound of S-triazine compound represented by the formula (I) and a trihalomethyl compound of oxadiazole compound represented by the formula (II) are known to exhibit sufficient photopolymerization initiation ability in combination with a light absorber such as an aromatic thiazole

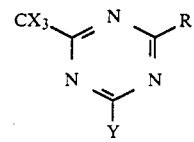

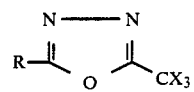

compound described in Japanese Patent Publication No. 28328/1983, merocyanine dye described in Japanese Patent Application (OPI) No. 151024/1979, aromatic thiopyrilium salts, aromatic pyrilium salts as described in Japanese Patent Application (OPI) No. 40302/1983 and 9-phenylacrydine,

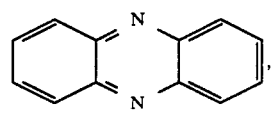

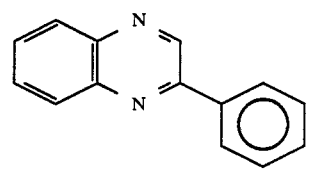

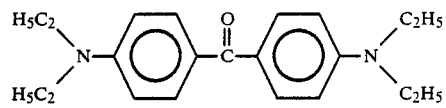

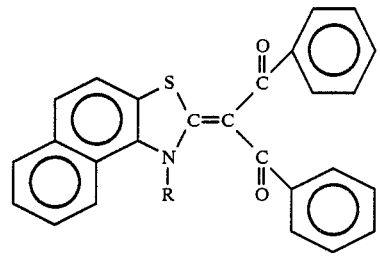

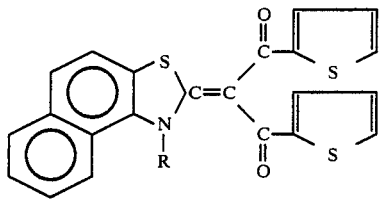

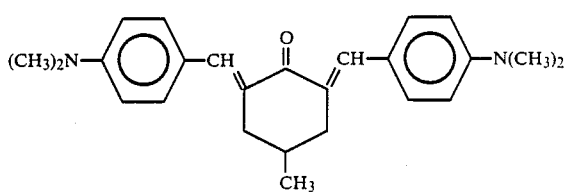

-continued

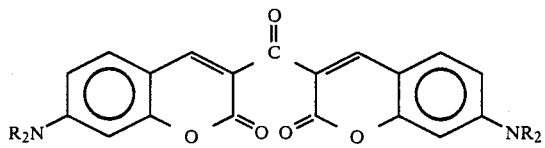

or in combination with a light absorber and a hydrogen donor such as N-phenylglycine, 2-mercaptobenzothiazole, N,N'-dimethylamino ethylbenzoate. (OPI stands for Open to Public Inspection and refers to an unexamined Japanese patent application.) However, the combination of radical generator and light absorber is affected by polymerization inhibition by oxygen during imagewise exposure step when it is used in the light-sensitive layer of a lithographic printing plate.

SUMMARY OF THE INVENTION

The present invention has been accomplished with a view toward solving the aforementioned problems of the prior art techniques discussed above.

An object of the present invention is to provide a photopolymerizable composition which is barely affected by oxygen during imagewise exposure step and which can provide a photo-setting image useful for making a light-sensitive printing plate precursor and photoresist.

The present invention was accomplished on the basis of the knowledge that, in the photopolymerizable composition, the effect of oxygen on the photopolymerizable composition during imagewise exposure can be decreased by adding carbazole compound to specific triazine type compounds and/or oxadiazole type compounds.

The present invention relates to a photopolymerizable composition which comprises (i) a monomer having at least one ethylenic unsaturated radical which is photopolymerizable under actinic light, (ii) at least one photopolymerization initiator selected from the group consisting of compounds represented by the formula (I)

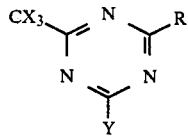

wherein X represents a halogen atom and Y represents —CH$_3$, —NH$_2$, —NHR', —NR$_2$, —OR' (wherein R' represents alkyl, substituted alkyl, aryl or substituted aryl and R represents —CX$_3$, alkyl, substituted alkyl, aryl, substituted aryl or substituted alkenyl) and compounds represented by the formula (II)

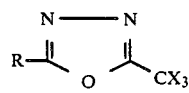

wherein X and R are the same as those of the formula (I) respectively, and (iii) a carbazole compound represented by the formula (III)

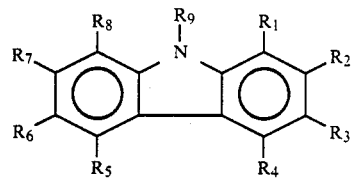

wherein R$_1$, R$_2$, R$_3$, R$_4$, R$_5$, R$_6$, R$_7$ and R$_8$ are hydrogen atom, halogen atom, alkyl, substituted alkyl, aryl, substituted acyl, substituted acyl, alkoxy, substituted alkoxy, acyloxy or substituted acyloxy, or at least one of R$_1$ and R$_2$, R$_2$ and R$_3$, R$_3$ and R$_4$, R$_5$ and R$_6$, R$_6$ and R$_7$, R$_7$ and R$_8$ form a ring respectively, R$_9$ represents alkyl, substituted alkyl, aryl, substituted aryl, acyl, substituted acyl, alkoxy, substituted alkoxy, acyloxy or substituted acyloxy.

The monomer having at least one ethylenic unsaturated radical which is photopolymerizable under actinic light is a monomer or oligomer which has a boiling point of at least 100° C. at ordinary pressure and a molecular weight of 10,000 or less and which has at least one, preferably 2 or more addition polymerizable ethylenic unsaturated radical per molecule. Examples of such monomer or oligomer include acrylate or metacrylate having one functional group such as polyethyleneglycol monoacrylate, polyethyleneglycol methacrylate, polypropyleneglycol monomethacrylate, polypropyleneglycol monomethacrylate, phenoxyethyl acrylate, phenoxyethyl methacrylate; compounds obtained by adding ethyleneoxide or propyleneoxide to polyalcohol such as glycerol or trimethylolethane and converting the resulting product to the (meth)acrylate form such as polyethyleneglycol diacrylate, polyethyleneglycol dimethacrylate, polypropyleneglycol diacrylate, polypropyleneglycol dimethacrylate, trimethylolethane triacrylate, trimethylolethane trimethacrylate, neopentylglycol diacrylate, neopentylglycol dimethacrylate, pentaerythritol triacrylate, pentaerythritol trimethacrylate, pentaerythritol tetraacrylate, pentaerythritol tetramethacrylate, dipentaerythritol hexaacrylate, dipentaerythritol hexamethacrylate, hexandiol diacrylate, hexandiol dimethacrylate, tri(acryloyloxyethyl) isocyanurate; urethanacrylate as described in Japanese Patent Publication Nos. 41708/1973 and 6034/1975 and Japanese Patent Application (OPI) No. 37193/1976; polyesteracrylate as described in Japanese Patent Application (OPI) No. 64182/1973, Japanese Patent Publication Nos. 43191/1974 and 30490/1977; and acrylates and methacrylates having 2 or more functional groups such as epoxyacrylates obtained by reacting epoxy resin with acrylic acid or methacrylates acid. Photo-setting monomer and oligomer described in Journal of the Adhesion Society of Japan, Vol. 20, No. 7, pages 300–308 may be used as the monomer.

Examples of the compound represented by the formula (I)

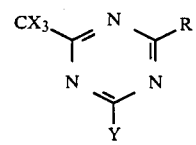

wherein X represents a halogen atom, Y represents —CH$_3$, —NH$_2$, —NHR', —NR$_2$, —OR' (wherein R' represents alkyl, substituted alkyl, aryl, substituted aryl; R represents —CX₃, alkyl, substituted alkyl, aryl, substituted aryl, substituted alkenyl) include compounds described in Wakabayashi et al, Bull. Chem. Soc. Japan, 42,2924(1969) such as 2-phenyl-4,6-bis(trichloromethyl)-S-triazine, 2-(p-chlorophenyl)-4,6-bis(trichloromethyl)-S-triazine, 2-(p-tolyl)-4,6 bis(trichloromethyl)-S-triazine, 2-(p-methoxyphenyl)-4,6-bis(trichloromethyl)-S-triazine, 2-(2',4'-dichlorophenyl)-4,6-bis(trichloromethyl)-S-triazine, 2,4,6-tris(trichloromethyl)-S-triazine, 2-methyl-4,6-bis(trichloromethyl)-S-triazine, 2-n-nonyl-4,6-bis(trichloromethyl)-S-triazine, 2-(α,α,β-trichloroethyl)-4,6-bis(trichloromethyl)-S-triazine. Examples of the compound (I) include compounds described in British Pat. No. 1388492 such as 2-styryl-4,6-bis(trichloromethyl)-S-triazine, 2-(p-methylstyryl)-4,6-bis(trichloromethyl)-S-triazine, 2-(p-methoxystyryl)-4,6-bis(trichloromethyl)-S-triazine, 2-(p-methoxystyryl)-4-amino-6-trichloromethyl-S-triazine; compounds described in Japanese Patent Application (OPI) No. 133428/1978 such as 2-(4-methoxy-naphtho-1-yl)-4,6-bis-trichloromethyl-S-triazine, 2-(4-ethoxy-naphtho-1-yl)-4,6-bis-trichloromethyl-S-triazine, 2-[4-(2-ethoxyethyl)-naphtho-1-yl]-4,6-bis-trichloromethyl-S-triazine, 2-[4,7-dimethoxynaphtho-1-yl]-4,6-bis-trichloromethyl-S-triazine, 2-(acetonaphtho-5-yl)-4,6-bis-trichloromethyl-S-triazine; compounds described in German Pat. No. 3337024 such as

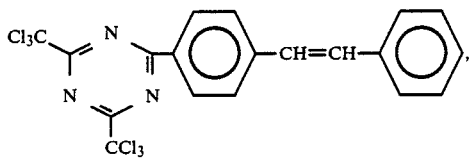

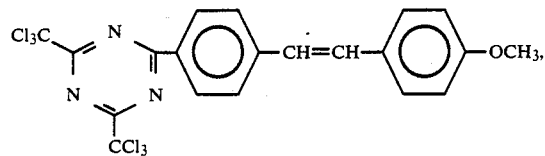

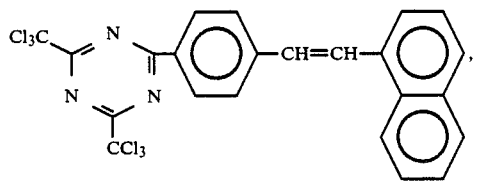

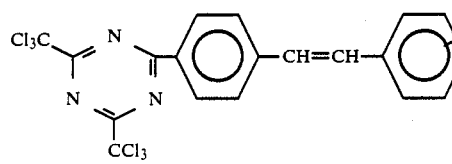

and the following compounds:

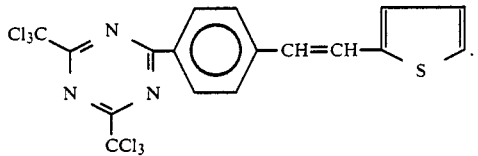

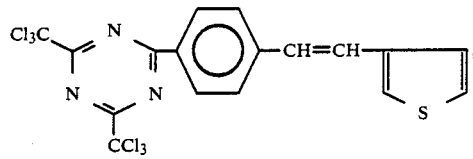

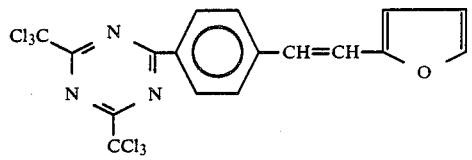

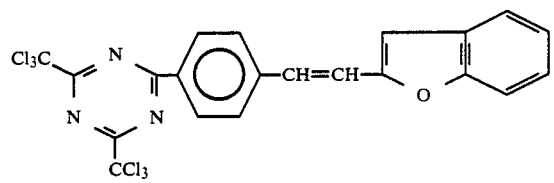

Examples of the compound (I) include compounds described in F. C. Schaefer et al, J. Org. Chem. 29,1527(1964) such as 2-methyl-4,6-bis(tribromomethyl)-S-triazine, 2,4,6-tris(tribromomethyl)-S-triazine, 2,4,6-tris(dibromomethyl)-S-triazine, 2-amino-4-methyl-6-tribromomethyl-S-triazine, 2-methoxy-4-methyl-6-trichloromethyl-S-triazine; and compounds described in Japanese Patent Application (OPI) No. 198868/1985 such as

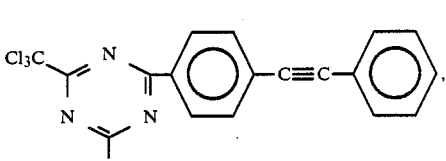

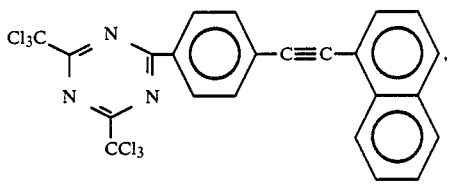

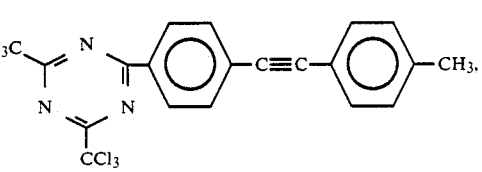

-continued

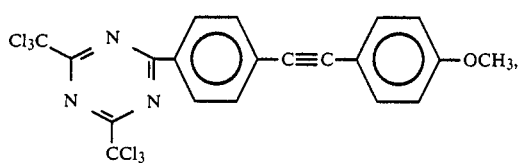

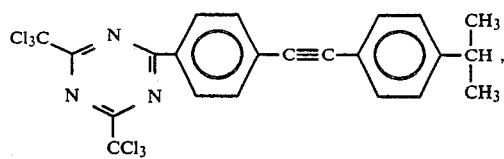

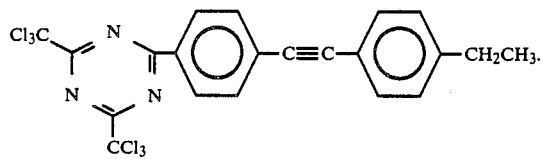

In the present invention, the compound (I) having —CX$_3$ as a radical Y is used preferably.

Examples of the compound represented by the formula (II)

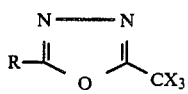
(II)

wherein X represents a halogen atom and Y represents —CX$_3$, —NH$_2$, —NHR', —NR$_2$ or —OR' (wherein R' represents alkyl, substituted alkyl, aryl or substituted aryl and R represents —CX$_3$, alkyl, substituted alkyl, aryl, substituted aryl or substituted alkenyl) include compounds described in Japanese Patent Publication No. 6096/1982 and Japanese Patent Application (OPI) No. 3626/1985 such as

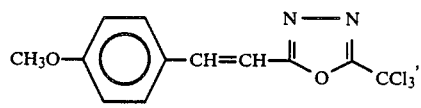

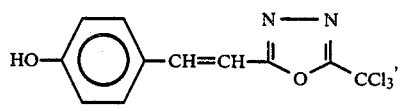

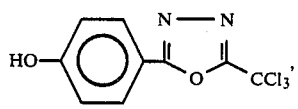

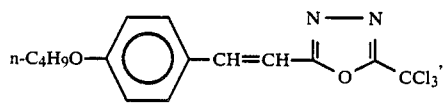

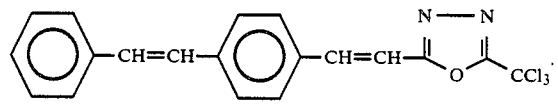

Substituents R$_1$ to R$_9$ of carbazole compound represented by the formula (III)

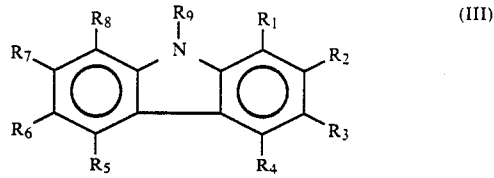
(III)

wherein R$_1$, R$_2$, R$_3$, R$_4$, R$_5$, R$_6$, R$_7$ and R$_8$ are hydrogen atom, halogen atom, alkyl, substituted alkyl, aryl, substituted aryl, acyl, substituted acyl, alkoxy, substituted alkoxy, acyloxy or substituted acyloxy, or at least one of R$_1$ and R$_2$, R$_2$ and R$_3$, R$_3$ and R$_4$, R$_5$ and R$_6$, R$_6$ and R$_7$, R$_7$ and R$_8$ form a ring; R$_9$ represents alkyl, substituted alkyl, aryl, substituted aryl, acyl, substituted acyl, alkoxy, substituted alkoxy, acyloxy or substituted acyloxy used as a light absorber in this invention are exemplified as follows:

Examples of halogen atom include Cl, Br and I. Examples of alkyl include methyl, ethyl, n-propyl, iso-propyl, n-butyl, iso-butyl, tert-butyl and the like. Examples of substituents of substituted alkyl include halogen atom, hydroxy, cyano, amino, aryl, alkoxy and the like. Examples of aryl include phenyl, naphthyl and the like. Examples of substituents of substituted aryl include halogen atom, hydroxy, cyano, amino, aryl, alkoxy and the like.

Examples of acyl include formyl, acetyl, propyonyl, butyryl, valeryl, benzoyl, toluoyl, salicyloyl, cinnamoyl, naphthoyl, phthaloyl, furoyl and the like. Examples of substituents of substituted acryl include halogen atom, hydroxy, cyano, amino, aryl and the like. Examples of alkoxy include methoxy, ethoxy, propoxy, butoxy, pentyloxy, hexyloxy and the like. Examples of substituents of substituted alkoxy include halogen atom, hydroxy, cyano, amino, aryl and the like. Examples of acyloxy include acetoxy, benzoyloxy and the like. Examples of substituents of substituted acyloxy include halogen atom, hydroxy, cyano, amino, aryl, alkoxy and the like.

Examples of the compound represented by the formula (III) include compounds described in Japanese Patent Application (OPI) No. 57340/1985 such as

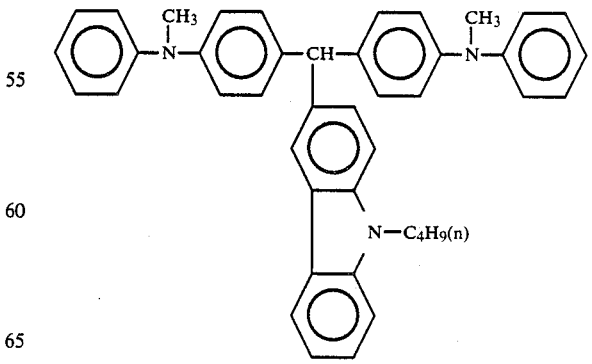

and

-continued

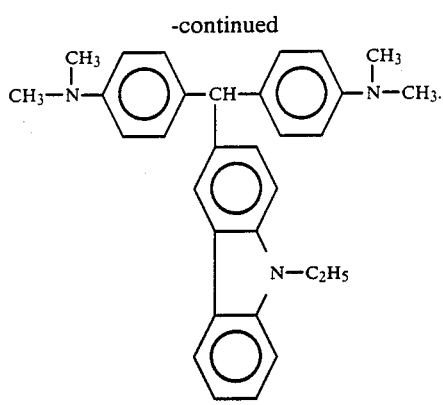

The carbazole compounds such as 9-formylcarbazole, 9-(β-cyanoethyl)carbazole, 9-(β-chloroethyl)carbazole, 9-(β-acetoxyethyl) carbazole, 9-ethylcarbazole, 9-phenylcarbazole, 9-methylcarbazole, 9-allylcarbazole, 3-amino-9-ethylcarbazole and the like are preferably used in the present invention.

The content of a photopolymerization initiator in the composition of the present invention is generally small and if the content is unsuitably much, undesirable phenomena such as interception of effective light occur.

The photopolymerization initiator and the carbazole are contained in the composition of this invention in the range of from 0.01 wt % to 20 wt %, preferably from 1 wt % to 10 wt % of the sum of the compounds represented by the formulas (I) and/or (II) and (III) on the basis of the weight of the photopolymerizable ethylenic unsaturated compound (and linear organic high-molecular polymer when used).

The weight ratio of photopolymerization initiator represented by the formula (I) and/or (II): carbazole compound represented by the formula (III) is preferably in the range of 80–20:20–80.

The photopolymerization initiation ability can be increased by adding hydrogen donor compounds such as N-phenylglycine, 2-mercaptobenzothiazole or N,N-dialkyl alkyl benzoate.

In this invention, the linear organic high-molecular polymer is selected from the compounds which are compatible with the photopolymerizable ethylenic unsaturated compound. Any linear organic high-molecular polymer compatible with the photopolymerizable ethylenic unsaturated compound may be used but one developable by water or a weak alkali aqueous solution is preferable. The linear organic high-molecular polymer used as a film-forming agent for the composition of this invention varies depending on whether the developing solution is, for example, water, a weak alkali aqueous solution or an organic solvent. For example, a composition containing a water soluble organic high-molecular polymer can be developed with water. Examples of such water soluble polymer include addition polymerization polymer having carbonic acid on the side chain thereof such as methacrylic acid copolymer, acrylic acid copolymer, itaconic acid copolymer, crotonic acid copolymer, maleic acid copolymer, particlly esterified maleic acid copolymer; and acid cellulose derivatives having carbonic acid on the side chain thereof. Polymers obtained by adding cyclic acid anhydride to addition polymerization polymer having hydroxy radical are also useful as the water soluble organic high-molecular polymer. Further, polyvinylpyrolidone, polyethyleneoxide and the like may be used as the water soluble organic high-molecular polymer. In order to increase the strength of the set film, alcohol soluble nylon and polyethers such as 2,2-bis-(4-hydroxyphenyl)-propane or epichlorohydrin may be used. Though the above mentioned linear organic high-molecular polymer may be admixed with the composition of this invention in a proper quality, 90 wt % or more of the content tends to have a bad influence on the formed image strength and the like.

In order to protect the polymerizable ethylenic unsaturated compound from undisered heat polymerization during production or storage of the light-sensitive composition, it is preferred that a small amount of heat polymerization inhibitor be added to the composition, in addition to the above mentioned basic ingredients. Suitable examples of the heat polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), 2-mercaptobenzoimidazole, N-nitrophenylhydroxyamine cerium (III) salt. Dye or pigment may be added for coloring of light sensitive layer and inorganic filler may be added for improvement on the physical properties of the set film if necessary.

The photopolymerizable composition of this invention may be applied on a support in the form of solution obtained by dissolving the composition in a suitable solvent such as 2-methoxyethanol, 2-methoxyethylacetate, propyleneglycol monomethylether, 3-methoxypropanol, 3-methoxypropylacetate, methylethylketone, ethylenedichloride and the like or a mixed solvent thereof. The coated amount of the composition suitably ranges between about 0.1 g/m$^2$ and about 10 g/m$^2$ on dry basis, preferably between 0.5 and 5 g/m$^2$.

The photopolymerizable composition of this invention may further contain various known additives such as a printing out agent for accomplishment of the objects of the invention.

The support used in the invention is a dimensionally stable sheet or plate. Examples of the dimensionally stable plate include plates used as a support of conventional printing plates and such plates may be used suitably. Examples of such plates include paper; paper laminated with plastics such as polyethylene, polypropylene or polystylene; metal plates such as aluminum including aluminum alloy, zinc or copper; plastic film such as cellulose diacetate, cellulose triacetate, cellulose propionate, cellulose butyrate, cellulose acetate butyrate, cellulose nitrate, polyethyleneterephthalate, polyethylene, polystyrene, polypropylene, polycarbonate or polyvinylacetal; paper and plastic laminated or deposited with the above mentioned metal plate. Among these supports, the aluminum plate is preferable since it has remarkable dimensional stability and is cheap. Further composite sheets described in Japanese Patent Publication No. 18327/1973 and prepared by coating aluminum sheets with polyethyleneterephthalate film are also preferable.

The supports having an aluminum film surface thereon are preferably subjected to treatments such as graining; immersion in an aqueous solution of sodium silicate, potassium fluorozirconate or phosphate; or anodizing. Further aluminum plates treated by graining and immersing in sodium silicate aqueous solution as described in U.S. Pat. No. 2,714,066 and aluminum plates treated by anodizing and immersing in an alkali metal silicate as described in Japanese Patent Publication No. 5125/1972 may also be preferably used. The anodizing treatment is conducted by electrolyzing an aluminum plate as an anode in an electrolyte such as an aqueous solution of inorganic acid (such as phosphoric acid, chromic acid, sulfonic acid or boric acid), organic acid (such as oxalic acid or sulfamic acid) or salts thereof, a non-aqueous solution, or a mixed solution thereof. Electrodeposition using a silicate as described in U.S. Pat. No. 3,658,662 is also useful as the treatment of the support. Combination of electrolytic graining of a support as disclosed in Japanese Patent Publication No. 27481/1971, Japanese Patent Application (OPI) Nos. 58602/1977 and 30503/1979 and the above mentioned anodizing treatment in combination with the aforementioned sodium silicate treatment may also be used as the surface treatment.

Further it is preferred that brush graining, electrolyte graining, anodizing treatment and sodium silicate treatment be conducted successively.

Supports primed with water soluble resin such as polyvinylsulfonic acid, polymers and copolymers having sulfonic acid radicals on a side chain after the treatment mentioned above are also preferable.

These so-called hydrophilic treatments are conducted for providing a hydrophilic surface on the support, for preventing harmful reaction of light-sensitive composition applied on the support and for improving adhesion of light-sensitive layer to the support.

In order to completely inhibit polymerization initiated with oxygen in air, protection layer comprising polymers having good oxygen interception properties such as polyvinylalcohol and acid celluloses may be provided on the photopolymerizable composition layer on the support. Methods for coating such protective layer are described in detail in, for example, U.S. Pat. No. 3,458,311 and Japanese Patent Publication No. 49729/1980.

Presensitized plates prepared by providing the photopolymerizable composition of the present invention on supports are imagewise exposed under light sources which are rich in ultraviolet rays such as metal halide lamps or high pressure mercury lamps. The exposed plates are treated with a developing solution, nonexposed areas of the light-sensitive layer on the plates are removed and subsequently the thus obtained plates are coated with gum solution to obtain printing plates. Preferable examples of the developing solution include an alkali aqueous solution containing small amount of an organic solvent such as benzylalcohol, 2-phenoxyethanol, 2-butoxyethanol as described in U.S. Pat. Nos. 3,475,171 and 3,615,480. Further the developing solution described in Japanese Patent Application (OPI) No. 26601/1975 and Japanese Patent Publication Nos. 39464/1981 and 42860/1981 excels as a developing solution of the presensitized printing plates.

The present invention provides a photopolymerizable composition which is barely affected by polymerization inhibition by oxygen during imagewise exposure step and which is suitable for using as a photo-sensitive layer of lithographic printing plates.

The following Examples further illustrate the present invention but are not intended to limit the scope of the invention in any manner.

EXAMPLE 1

Base plates were prepared by the method disclosed in Japanese Patent Application (OPI) No. 28893/1981. That is, aluminum plates 0.30 mm thick were grained with a nylon brush and an aqueous suspension of pumice powder (400 mesh). After thorough washing with water, the plates were etched by immersion in a 10% aqueous solution of sodium hydroxide for 60 seconds at 70° C. The etched plates were washed under flushing water, neutralized with 20% nitric acid and washed again. The plates were then roughened by the electrochemical method wherein an alternating sine-wave current ($V_A$, 12.7 volts) was applied to a 1% aqueous solution of nitric acid such that the quantity of electricity at the anode time was 160 coulmbs/dm$^2$. The roughness of the surface of the obtained plates were 0.6μ (Ra nominal value). The plates were then desmutted by immersion in a 30% aqueous solution of sulfuric acid for 2 minutes at 55° C. Thereafter, the plates were anodized by using 2 A/dm$^2$ of current density in a 20% aqueous solution of sulfuric acid for 2 minutes to provide an anodic film with a thickness of 2.7 g/m$^2$. The anodized plates were immersed in a 2.5% aqueous solution of sodium silicate for 1 minute at 70° C., and subsequently washed with water and dried.

The thus prepared aluminum plates were coated with sensitizer solution having the formulation indicated below in the coating weight of 2.0 g/m$^2$ on a dry basis, and subsequently dried at 100° C. for 2 minutes to obtain presensitized plates. The photopolymerization initiators, carbazole compounds and the used amount thereof are shown in Table 1.

| [Sensitizer solution] | |
|---|---|
| Trimethyolpropantriacrylate | 1 g |
| Copolymer of acrylmethacrylate/ methacrylic acid (mole ratio 85:15) | 3 g |
| Photopolymerization initiator | X g |
| Carbazole compound (light absorber) | Y g |
| Dodecylbenzene sulfonate of the condensation product of p-diazodiphenylamine and formaldehyde | 0.15 g |
| Oil blue #603 (Orient Chemical Industry K.K.) | 0.05 g |
| F-177 (fluorine surface active agent, produced by Dainippon Ink K.K.) | 0.05 g |
| Ethyleneglycolmonomethylether | 25 g |
| Methanol | 7.5 g |
| Methyethylketone | 15 g |

The thus prepared presensitized plates were exposed under 2 KW metal halide lamp (Printer FT26V 2 UPNS produced by Nuarc Inc. in U.S.A.) placed at a distance of 1 m for 100 counts. As the plates were exposed, the reduced pressure in a contact print frame of the printer was varied. The sensitivity of the plates were measured by a Fuji PS step guide (produced by Fuji Photo Film K.K.) which is a gray scale having discontinuous transmission density with 0.15 of ΔD.

Thereafter, the development was conducted by treating the plates with a developing solution described in Japanese Patent Publication No. 42860/1981 and having the formula indicated below and by removing unexposed areas.

The sensitivity of plates using various combinations of photopolymerization initiators were measured under 0 torr and 600 torr of pressure in the printer. The results were as shown in Table 1.

TABLE 1
Sensitivity and combination of photopolymerization initiator and carbazole compound
| Run No. | Photopolymerization initiator Carbazole compound | | Number of solid black steps of gray scale Pressure in Printer | |
|---|---|---|---|---|
| | | | 0 Torr | 600 Torr |
| 1 | 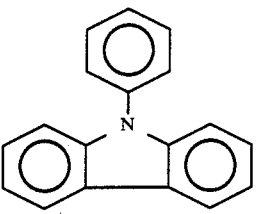 | 0.1 g | 10 | 9 |
| | 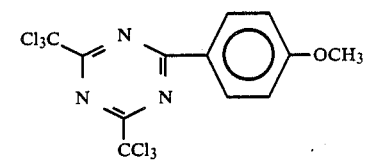 | 0.1 g | | |
| 2 | 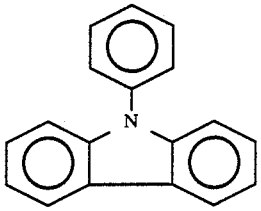 | 0.1 g | 13 | 12 |
| | 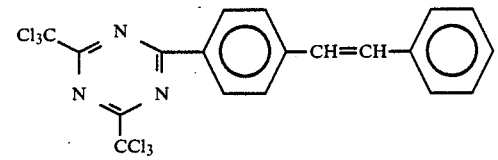 | 0.1 g | | |
| 3 | 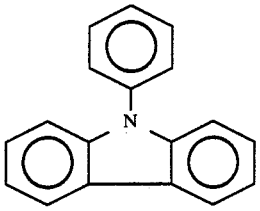 | 0.1 g | 12 | 11 |
| | 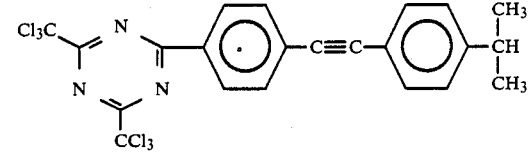 | 0.1 g | | |
| 4 | 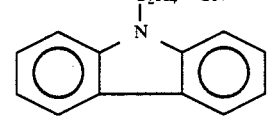 | 0.1 g | 11 | 10 |

TABLE 1-continued
Sensitivity and combination of photopolymerization initiator and carbazole compound
| Run No. | Photopolymerization initiator Carbazole compound | | Number of solid black steps of gray scale Pressure in Printer | |
|---|---|---|---|---|
| | | | 0 Torr | 600 Torr |
| | 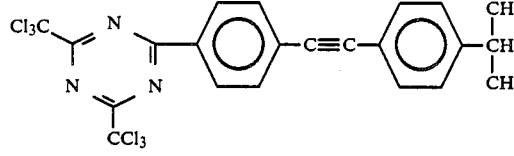 | 0.1 g | | |
| 5 | 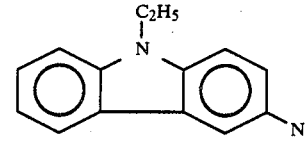 | 0.1 g | 11 | 10 |
| | 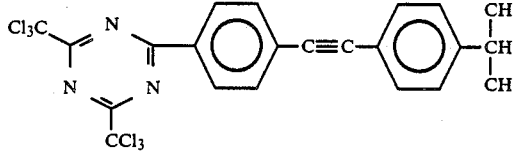 | 0.1 g | | |
| 6 | 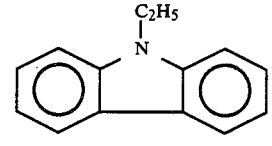 | 0.1 g | 12 | 11 |
| | 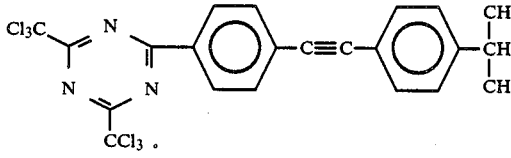 | 0.1 g | | |
| 7 | 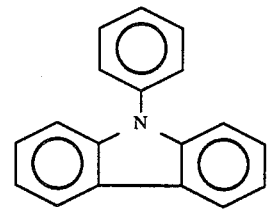 | 0.1 g | 9 | 8 |
| | 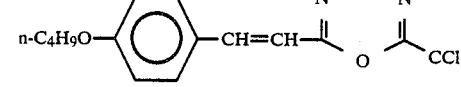 | 0.1 g | | |
| 8 | 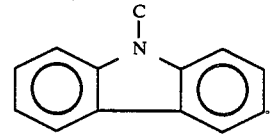 | 0.1 g | 10 | 9 |
| | 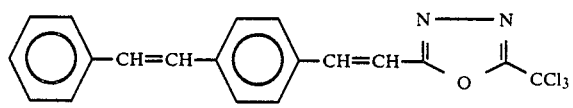 | 0.1 g | | |

TABLE 1-continued
Sensitivity and combination of photopolymerization initiator and carbazole compound
| Run No. | Photopolymerization initiator Carbazole compound | | Number of solid black steps of gray scale Pressure in Printer | |
|---|---|---|---|---|
| | | | 0 Torr | 600 Torr |
| C-1 | 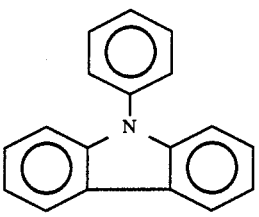 | 0.1 g | 0 | 0 |
| C-2 | 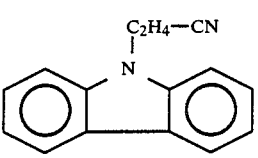 | 0.1 g | 0 | 0 |
| C-3 | 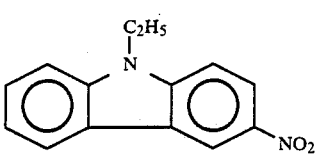 | 0.1 g | 0 | 0 |
| C-4 | 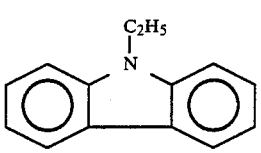 | 0.1 g | 0 | 0 |
| C-5 | 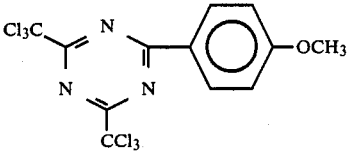 | 0.1 g | 8 | 4 |
| C-6 | 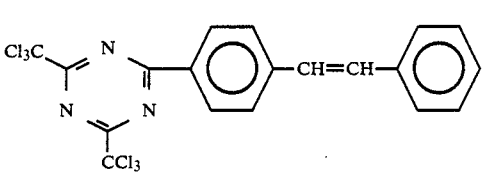 | 0.1 g | 11 | 6 |
| C-7 | 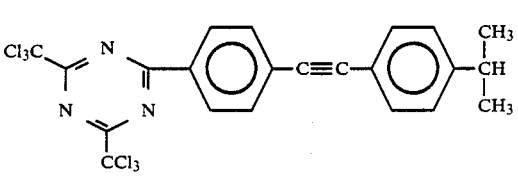 | 0.1 g | 10 | 5 |
| C-8 | 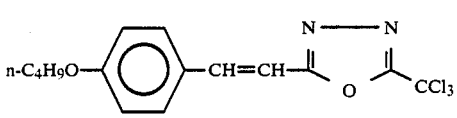 | 0.1 g | 7 | 4 |
| C-9 | 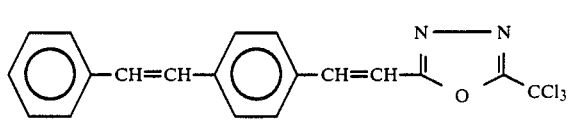 | 0.1 g | 8 | 4 |

TABLE 1-continued

Sensitivity and combination of photopolymerization initiator and carbazole compound

| Run No. | Photopolymerization initiator Carbazole compound | | Number of solid black steps of gray scale Pressure in Printer | |
|---|---|---|---|---|
| | | | 0 Torr | 600 Torr |
| C-10 | [structure: 9-phenylacridine] | 0.1 g | 11 | 5 |
| | [structure: Cl₃C-triazine with phenyl-C≡C-phenyl-CH(CH₃)₂] | 0.1 g | | |
| C-11 | [structure: naphthothiazoline with dibenzoylmethylene, N-CH₃] | 0.1 g | 11 | 6 |
| | [structure: Cl₃C-triazine with phenyl-C≡C-phenyl-CH(CH₃)₂] | 0.1 g | | |

Run Nos. 1 to 8 are examples of the present invention.
Run Nos. C-1 to C-11 are comparative examples.

As seen from the results shown in Table 1, in comparison with the cases that a sensitizer containing only conventional photopolymerization initiator was used, in the cases that the composition of the present invention containing carbazole compound represented by the formula (III) as a sensitizer in addition to photopolymerization initiator was used, the sensitivity of the plates was high and relatively high sensitivity was maintained under a pressure of 600 torr in the printer used. Further, in comparison with the cases that sensitizers which contain photopolymerization initiator and light absorber which are shown as C-10 and C-11 were used, the degree of decrease of the sensitivity was small in the case that the exposure was conducted under pressure of 600 torr in the used printer.

EXAMPLE 2

Presensitized plates were prepared by the same procedures as those of Example 1 except that a sensitizing solution having the formula indicated below was used.

| [Sensitizer solution] | |
|---|---|
| Dipentaerythritolhexaacrylate | 1 g |
| Copolymer of acrylmetacrylate/ benzylmetacrylate/metacrylic acid (copolymerization mole ratio = 70:15:15) | 3 g |
| Photopolymerization initiator | X g |
| Carbazole compound | Y g |
| Hexafluoride phosphate of the condensation product of p-diazodiphenylamine and formaldehyde | 0.15 g |
| Oil blue #603 (Orient Chemical Industry K.K.) | 0.05 g |
| F-177 (fluorine surface active agent, produced by Dainippon Ink K.K.) | 0.05 g |
| Ethyleneglycolmonomethylether | 25 g |
| Methanol | 7.5 g |
| Methylethylketone | 15 g |

The effect of pressure in the printer on the prepared plates was studied by the same manner as that of Example 1. The results are shown in Table 2 together with photopolymerization initiators, carbazole compounds (light absorbers) and the used amount thereof.

TABLE 2
Sensitivity and combination of photopolymerization inhibitor and carbazole compound
| Run No. | Photopolymerization initiator / Carbazole compound | Number of solid black steps of gray scale Pressure in Printer | |
|---|---|---|---|
| | | 0 Torr | 600 Torr |
| 1 |  | 9 | 8 |
| 2 | 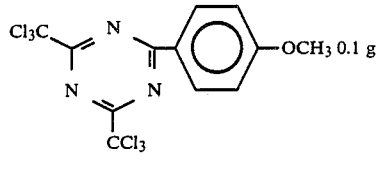 | 12 | 11 |
| 3 |  | 11 | 10 |
| 4 | 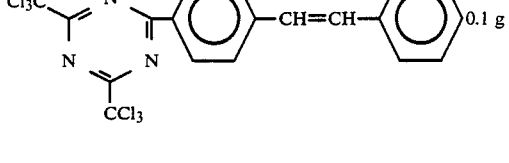 | 10 | 9 |

TABLE 2-continued
Sensitivity and combination of photopolymerization inhibitor and carbazole compound
| Run No. | Photopolymerization initiator Carbazole compound | Number of solid black steps of gray scale Pressure in Printer | |
|---|---|---|---|
| | | 0 Torr | 600 Torr |
| 5 | 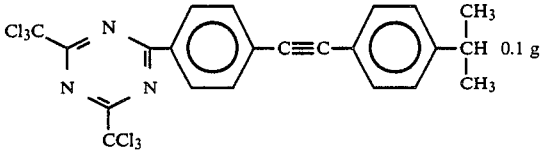 | 10 | 9 |
| 6 | 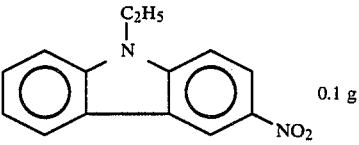 | 11 | 10 |
| 7 | 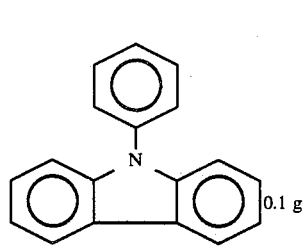 | 8 | 7 |
| 8 | 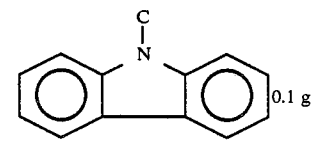 | 9 | 8 |

TABLE 2-continued
Sensitivity and combination of photopolymerization inhibitor and carbazole compound
| Run No. | Photopolymerization initiator Carbazole compound | Number of solid black steps of gray scale Pressure in Printer | |
|---|---|---|---|
| | | 0 Torr | 600 Torr |
| C-1 | 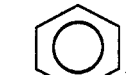 0.1 g | 0 | 0 |
| C-2 | 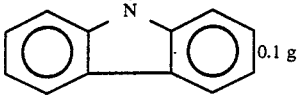 0.1 g | 0 | 0 |
| C-3 | 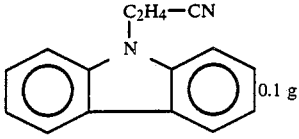 0.1 g | 0 | 0 |
| C-4 | 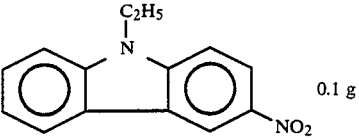 0.1 g | 0 | 0 |
| C-5 | 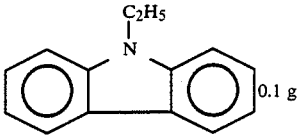 0.1 g | 7 | 4 |
| C-6 | 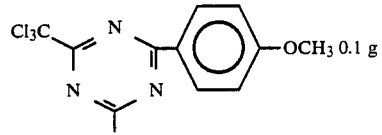 0.1 g | 10 | 5 |
| C-7 | 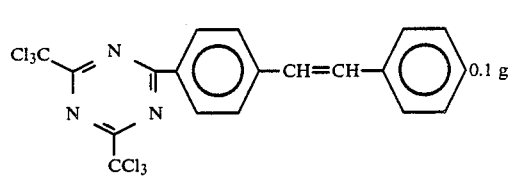 0.1 g | 9 | 5 |
| C-8 | 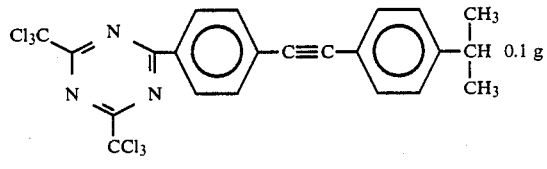 0.1 g | 6 | 3 |
| C-9 | 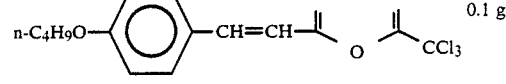 0.1 g | 7 | 4 |

TABLE 2-continued

Sensitivity and combination of photopolymerization inhibitor and carbazole compound

| Run No. | Photopolymerization initiator Carbazole compound | Number of solid black steps of gray scale Pressure in Printer | |
|---|---|---|---|
| | | 0 Torr | 600 Torr |
| C-10 | 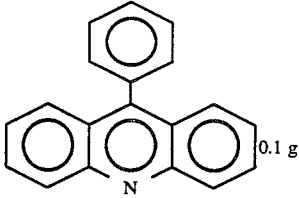 0.1 g <br> 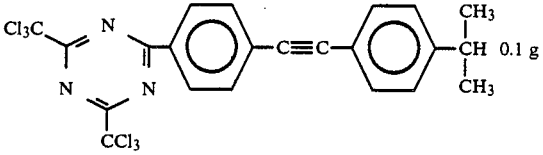 0.1 g | 10 | 5 |
| C-11 | 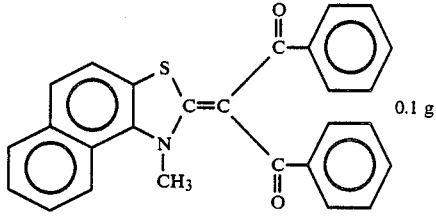 0.1 g <br> 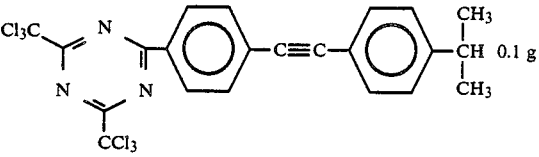 0.1 g | 10 | 5 |

Run Nos. 1 to 8 are examples of the present invention.
Run Nos. C-1 to C-11 are comparative examples.

As seen from the results shown in Table 2, in comparison with the cases that a sensitizer containing only conventional photopolymerization initiator was used, in the cases that the composition of the present invention containing carbazole compound represented by the formula (III) as a sensitizer in addition to photopolymerization initiator was used, the sensitivity of the plates was high and relatively high sensitivity was maintained under a pressure of 600 torr in the printer used. Further, in comparison with the cases that sensitizers which contain photopolymerization initiator and light absorber which are shown as C-10 and C-11 were used, the degree of decrease of the sensitivity was small in the case that the exposure was conducted under pressure of 600 torr in the used printer.

I claim:

1. A photopolymerizable composition which comprises
   (i) a monomer having at least one ethylenic unsaturated radical which is photopolymerizable under actinic light,
   (ii) at least one photopolymerization initiator selected from the group consisting of compounds represented by the formula (I)

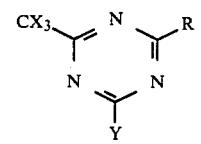 (I)

wherein X represents a halogen atom and Y represents —CH$_3$, —NH$_2$, —NHR', —NR$_2$, —OR' (wherein R' represents alkyl, substituted alkyl, aryl or substituted aryl and R represents —CX$_3$, alkyl, substituted alkyl, aryl, substituted aryl or substituted alkenyl) and compounds represented by the formula (II)

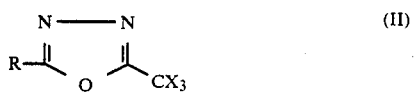 (II)

wherein X and R are the same as those of the formula (I) respectively, and
   (iii) a carbazole compound represented by the formula (III)

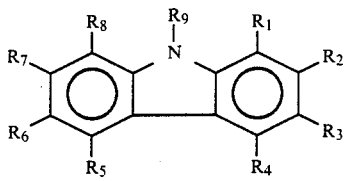

(III)

wherein $R_1$, $R_2$, $R_3$, $R_4$, $R_5$, $R_6$, $R_7$ and $R_8$ are hydrogen atom, halogen atom, alkyl, substituted alkyl, aryl, substituted aryl acyl, substituted acyl, alkoxy, substituted alkoxy, acyloxy or substituted acyloxy, or at least one of $R_1$ and $R_2$, $R_2$ and $R_3$, $R_3$ and $R_4$, $R_5$ and $R_6$, $R_6$ and $R_7$, $R_7$ and $R_8$ form a ring respectively, $R_9$ represents alkyl, substituted alkyl, aryl, substituted aryl, acyl, substituted acyl, alkoxy, substituted alkoxy, acyloxy or substituted acyloxy.

2. The photopolymerizable composition of claim 1 wherein the composition further comprises a linear organic high-molecular polymer.

3. The photopolymerizable composition of claim 1 wherein the monomer having at least one ethylenic unsaturated radical which is photopolymerizable under actinic light is a monomer or oligomer which has a boiling point of at least 100° C. at ordinary pressure and a molecular weight of 10,000 or less and which has at least one addition polymerizable ethylenic unsaturated radical per molecule.

4. The photopolymerizable composition of claim 1 wherein the contents of the compounds represented by the formula (I) and/or (II) and the compound represented by the formula (III) range from 0.01 wt % to 20 wt % in total on the basis of the weight of the photopolymerizable ethylenic unsaturated compound.

5. The photopolymerizable composition of claim 2 wherein the contents of the compounds represented by the formula (I) and/or (II) and the compound represented by the formula (III) range from 0.01 wt % to 20 wt % in total on the basis of the weight of the photopolymerizable ethylenic unsaturated compound and the linear organic high-molecular polymer.

6. The photopolymerizable composition of claim 1 wherein the weight ratio of the compound represented by the formula (I) and/or (II): the compound represented by the formula (III) is in the range of 80-20:-20-80.

7. The photopolymerizable composition of claim 1 wherein the photopolymerization initiator is the compound represented by the formula (I).

8. The photopolymerizable composition of claim 1 wherein the photopolymerization initiator is the compound represented by the formula (II).

9. The photopolymerizable composition of claim 1 wherein the radical Y of the compound represented by the formula (I) is $-CX_3$.

10. The photopolymerizable composition of claim 2 wherein the linear organic high-molecular polymer is compatible with the monomer having at least one ethylenic unsaturated radical which is photopolymerizable under actinic light.

11. The photopolymerizable composition of claim 1 wherein the composition further comprises a heat polymerization inhibitor.

* * * * *

UNITED STATES PATENT AND TRADEMARK OFFICE
CERTIFICATE OF CORRECTION

PATENT NO. : 4,774,163

DATED : September 27, 1988

INVENTOR(S) : Tatsuji Higashi

It is certified that error appears in the above-identified patent and that said Letters Patent is hereby corrected as shown below:

Formulas:

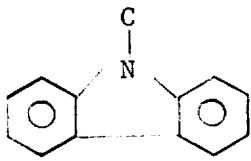

Used in Run No. 8 (column 15-16) to

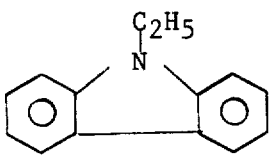

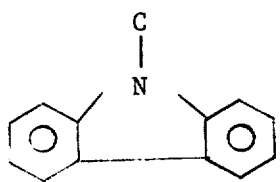

Used in Run No. 8 (columns 23-24) to

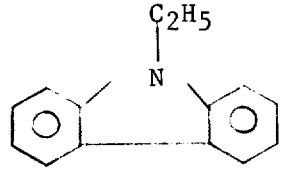

UNITED STATES PATENT AND TRADEMARK OFFICE
CERTIFICATE OF CORRECTION

PATENT NO. : 4,774,163
DATED : September 27, 1988
INVENTOR(S) : Tatsuji Higashi

It is certified that error appears in the above-identified patent and that said Letters Patent is hereby corrected as shown below:

Formula:

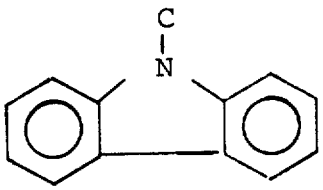

used in Run No. 8 (col. 15-16) to

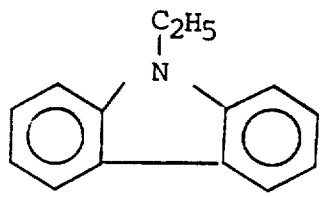

Signed and Sealed this

Tenth Day of July, 1990

*Attest:*

HARRY F. MANBECK, JR.

*Attesting Officer*       *Commissioner of Patents and Trademarks*